United States Patent [19]

Mizuta et al.

[11] Patent Number: 5,039,654
[45] Date of Patent: Aug. 13, 1991

[54] SUPERCONDUCTIVE MATERIAL AND METHOD OF PREPARING SAME

[75] Inventors: Susumu Mizuta; Toshiya Kumagai; Wakichi Kondo; Kenji Kawaguchi; Shigemitsu Shin; Hiroshi Yokota, all of Ibaraki, Japan

[73] Assignee: Director-General of Agency of Industrial Science and Technology, Japan

[21] Appl. No.: 373,599

[22] Filed: Jun. 30, 1989

Related U.S. Application Data

[63] Continuation of Ser. No. 117,965, Nov. 9, 1987, abandoned.

[30] Foreign Application Priority Data

Jan. 30, 1987 [JP] Japan .................................. 62-21128
May 12, 1987 [JP] Japan ................................ 62-115186

[51] Int. Cl.$^5$ .......................... B05D 5/12; H01L 39/12
[52] U.S. Cl. ......................................... 505/1; 505/700; 505/734; 505/741; 427/62; 427/226; 428/702
[58] Field of Search ................... 505/1, 734, 737, 700; 427/62, 63, 226; 428/702

[56] References Cited

U.S. PATENT DOCUMENTS

| | | | |
|---|---|---|---|
| 3,865,923 | 2/1975 | Stephens | 502/303 |
| 4,151,123 | 4/1979 | McCann | 502/303 |
| 4,485,094 | 11/1984 | Pebler | 427/226 |
| 4,485,191 | 11/1984 | Sekido et al. | 502/525 |
| 4,511,673 | 4/1985 | Eto | 502/525 |
| 4,880,770 | 11/1989 | Mir et al. | 505/1 |
| 4,897,378 | 1/1990 | Chiang | 505/1 |

OTHER PUBLICATIONS

Bednorz et al, *Z. Phys. B-Cond. Matter*, 64, 189–193 (1986).
Koinuma et al, *Jap. J. of App. Phys.*, vol. 26, No. 4 (Apr. 1987) pp. L399–L401.
Uchida et al, *Jap. J. of App. Phys.*, vol. 26, No. 1 (Jan. 1987) pp. L1–L2.
Wang et al, *Inorganic Chem.*, vol. 26 (May 1987) pp. 1474–1476.

*Primary Examiner*—Michael Lusignan
*Assistant Examiner*—Margaret Burke
*Attorney, Agent, or Firm*—Lorusso & Loud

[57] ABSTRACT

A superconductive material including a substrate and a superconductive layer of a double oxide of metals provided on the substrate is produced by a method which comprises the steps of:
 (a) providing a solution containing a blend of metal compounds having a composition corresponding to that of the double oxide;
 (b) applying the solution on the substrate to form a liquid film;
 (c) drying the liquid film; and
 (d) calcining the dried film to convert the metal compounds into the superconductive double oxide of the metals.

17 Claims, No Drawings

SUPERCONDUCTIVE MATERIAL AND METHOD OF PREPARING SAME

This application is a continuation of application Ser. No. 07/117,965, filed Nov. 9, 1987 now abandoned.

BACKGROUND OF THE INVENTION

This invention relates to a superconductive material and to a method of preparing same.

There are now increasing reports on a variety of double metal oxides exhibiting superconductivity. Examples of such oxides include $(La_{0.9}Sr_{0.1})_2CuO_4$, $(La_{0.9}Ba_{0.1})_2CuO_4$ and $YBa_2Cu_3O_7$. These superconductive metal oxides of a ceramic type have thus far been prepared by a vapor phase method or a tape cast method. The former method requires the use of a large, elaborate apparatus. Further, the vapor phase method cannot prepare a superconductive material having a large surface area. The latter method fails to give films with a thin, uniform thickness of less than 20 um (micrometer). Additionally, the tape cast method requires a high sintering temperature. From the stand point of actual industrial applications, it is highly desirous to provide superconductive materials having various shapes such as thin films, thin wires, tubes and rods. With the known methods, however, it is impossible or extremely difficult to produce ceramic type superconductive materials with such shapes.

SUMMARY OF THE INVENTION

It is, therefore, an object of the present invention to provide economical method of producing superconductive materials which is devoid of the drawbacks of the conventional method.

It is a special object of the present invention to provide a method capable of producing superconductive materials having any desired shape such as a thin wire, a thin film or a tube.

It is a further object of the present invention to provide superconductive materials in a form suitable for actual utilization such as for superconductive elements or magnets.

In accomplishing the foregoing objects there is provided in accordance with the present invention a method of preparing a superconductive material having a superconductive layer of a double oxide of metals provided on a substrate, said method comprising the steps of:
  (a) providing a solution containing a blend of metal compounds having a composition corresponding to that of the double oxide;
  (b) applying said solution on the substrate to form a liquid film;
  (c) drying said liquid film; and
  (d) calcining said dried film to convert said metal compounds to the double oxide of said metals.

In another aspect, the present invention provides a superconductive composite material produced by the above method.

Other objects, features and advantages of the present invention will become apparent from the detailed description of the present invention to follow.

DETAILED DESCRIPTION OF THE INVENTION

The present invention provides a superconductive material including a substrate and a superconductive layer of double oxide of metals provided at least a portion of the surface of the substrate. The superconductive material is produced by a method including the following steps.

(a) Preparation of Coating Solution:

In this step a coating solution containing a blend of metal compounds is prepared. The contents of the metal compounds in the blend are so determined as to provide the desired double oxide of the metals. That is, the molar ratios of the metal compounds in the blend are equivalent to those of the metals in the double oxide. For example, if a superconductive metal oxide having a formula $(La_{0.9}Sr_{0.1})_2CuO_4$ is intended, a coating solution containing La, Sr and Cu compounds and having contents of the La and Sr compounds of 1.8 and 0.2 moles, respectively, per mole of the Cu compound is used.

Any metal compound ma be used as long as it gives an oxide upon calcination. A metal compound which is decomposed at a temperature of preferably 1000° C. or below, more preferably 200–900° C. is suitably used. Examples of metal compounds include metal salts of organic or inorganic acids such as naphthenic acid, 2-ethyl hexanoic acid, caprylic acid, stearic acid, lauric acid, butyric acid, propionic acid, oxalic acid, citric acid, lactic acid, phenol, cathechol, benzoic acid, salcilic acid, ethylenediaminetetracetic acid, nitric acid, carbonic acid, and hydrochloric acid; metal alkoxides such as ethoxides, propoxides, isopropoxides, butoxides, ethyelene glycoxides and glycerides; and chelate compounds such as metal acetylacetonates.

Above all, metal compounds having an oxygen atom directly bonded to the metal, such as organic acid salts, alkoxides, acetylacetonates and nitrates, are preferably used because of ease in converting them into metal oxides upon calcination. Organic or inorganic metal compounds used as starting metal compounds and containing no oxygen directly bonded to the metals may be converted into such preferred metal compounds when used in conjunction with a suitable solvent such as an organic acid, an alcohol, acetylacetone or nitric acid.

Any solvent may be used as long as it can dissolve the metal compounds. Examples of suitable solvents include hydrocarbons such as hexane, octane, benzene, toluene and tetralin; alcohols such as methanol, ethanol, propanol, butanol and amyl alcohol; ketones such as acetone, methyl ethyl ketone and acetylacetone; ethers such as dibutyl ether; aldehydes such as acetoaldehyde and benzaldehyde; organic acids such as formic acid, acetic acid, propionic acid, butylic acid, caprilic acid, lauric acid, stearic acid, naphthenic acid, linoleic acid, oleic acid, oxalic acid, citric acid, lactic acid, phenol and p-toluic acid; esters such as butylbutylate; amines such as dimethylamine and aniline; amides such as N-methylacetamide and formamide; sulfur compounds such as dimethylsulfoxide; and heterocyclic compounds such as pyridine and furfural. Aqueous solvents such as water, aqueous ammonia and aqueous nitric acid may also be used. These solvents may be used singly or in combination of two or more and suitably selected according to the metal compounds to be dissolved.

The coating solution may be prepared by, for example, dissolving a blend of metal compounds in a solvent. Alternatively, each metal compound is first dissolved in a suitable solvent and, then, the resultant solutions are mixed in suitable proportions. The concentration of the coating solution is not specifically limited but is, generally, 3–40 % by weight. The coating solution may further contain suitable additives such as a viscosity controlling agent, e.g. polyvinyl alcohol.

(b) Liquid Film Forming Step:

The coating solution obtained in the above step (a) is applied on at least a portion of the surface of a substrate to form a liquid film over that surface. The substrate may be formed of a metal or a metal alloy such as copper, titanium, lead or a stainless steel, a metal oxide such as alumina, zirconia or titania, or a ceramic material such as silicon carbide or graphite. The shape of the substrate is not specifically limited. Substrates having curved or flat surfaces, such as plates, wires, coils, fibers, fabrics, tubes, blocks and rods may be used. Porous substrate may also be used.

Coating of the coating solution may be performed by any suitably way such as by a dip coating, spray coating or brush coating method.

(c) Drying of Liquid Film:

The substrate having a coated liquid film is then dried at room or an elevated temperature under ambient or a reduced pressure. It is not necessary to completely dry the film since the drying step is followed by a calcination step at an early stage of which drying may be completed.

(d) Calcination Step:

The dried (or semidried) film containing the metal compounds and formed on the substrate is subjected to calcination to convert the metal compounds into the desired superconductive double oxide of the metals.

The calcination temperature varies with the kind of the double oxide, but generally in the range of 500-1000 °C. When the metal compounds are organic compounds, they are decomposed or oxidized at temperatures of 200-500 °C. and crystallization or double metal oxide forming reaction takes place at temperatures of 500-1000 °C. Inorganic metal compounds such as metal nitrates, hydroxides, carbonates or halides are decomposed and oxidized to form double metal oxides at temperatures of 1000 °C. or below.

The calcination is preferably performed for 0.5 hour or more, more preferably 1-72 hours. The calcination step and the above-described drying step may be conducted separately or continuously. The atmosphere in which the calcination is performed may be, for example, air, oxygen, nitrogen or argon. Calcination in an oxygen-free atmosphere should be followed by calcination in oxygen-containing atmosphere at 500-1000 °C. In the calcination step, pressurized condition, ambient pressure or reduced pressure may be used.

The calcination product is then allowed to be cooled to room temperature to obtain a superconductive composite material having a superconductive layer of the double oxide of metals provided over the surface of the substrate. The method of the present invention can form superconductive composite materials having a superconductive layer with a thickness of 0.01-20 um, especially 0.1-10 um. The thickness of the superconductive layer may be controlled by adjusting the concentration of the metal compounds in the coating solution or by repeating the coating and calcination steps suitable times.

The method of the present invention is particularly suited for the production of superconductive materials having a superconductive layer of the following oxides. However, the present invention is applicable to any other superconductive metal oxides.

$AB_2Cu_3O_{7-x}$ $(La_{1-y}Z_y)_2CuO_{4-z}$

In the above formulae:

A : Y, La, Nd, Sm, Eu, Gd, Dy, Ho, Er, Yb, Lu, or a mixture of two or more thereof;

B : Ba, Sr, Ca or a mixture of two or more thereof;

x : a number greater than −1 but less than +1;

Z : Ba, Sr, Ca or a mixture of two or more thereof,

Y : a number greater than 0 but not greater than 0.2; and z : a number less than 1 but not less than 0.

The following examples will further illustrate the present invention.

EXAMPLE 1

| | |
|---|---|
| Metal compounds: | lanthanum naphthenate (La 1.85) |
| (Molar ratio | strontium naphthenate (Sr 0.15) |
| of metal) | copper naphthenate (Cu 1.00) |
| Solvent: | butanol |
| Concentration of metal compounds: | 10% by weight |
| Substrate: | alumina thin plate |
| Calcination: | |
| Atmosphere: | air |
| Temperature: | 900° C. |
| Time: | 0.5 hour |
| Number of repetition: | 10 times |
| Critical temperature: | |
| On set: | 30K |
| Perfect superconductive: | 10K |

The metal compounds shown above were mixed with each other and the mixture dissolved in the above solvent to give a coating solution having the total metal compounds concentration shown above and having the molar ratio of the metals as shown above. The coating solution was applied on the substrate shown above by immersing the substrate in the coating solution and the coat was dried in the air. Then the substrate having the dried coat was calcined under the conditions shown above. The immersing, drying and calcining steps were repeated 10 times to give a superconductive material whose electrical resistivity was abruptly decreased at the temperature (on set) shown above and which exhibited perfect superconductivity at the temperature shown above.

The above procedure was repeated in the same manner as described using an alumina bar (diameter 1 mm) in place of the alumina plate as a substrate. The resultant superconductive composite materials showed similar critical temperature.

The electrical conductivity was measured by the four termini method in which four spaced apart electrodes with about 2 mm distance were provided on the superconductive layer by coating a silver paste thereon.

Examples 2-22 were conducted to prepare various superconductive materials under conditions as summarized below. In each of Examples 2-22, the procedure including coating, drying and 1st stage calcination steps was repeated in the number indicated below. Thereafter, the 2nd stage calcination was performed in an oxygen-containing atmosphere. The calcined product was then gradually cooled to room temperature.

EXAMPLE 2

| | |
|---|---|
| Metal compounds: | lanthanum caprylate (La 1.90) |

| | -continued | |
|---|---|---|
| (Molar ratio of metal) | barium butyrate (Ba 0.05) strontium naphthenate (Sr 0.05) copper propionate (Cu 1.00) | |
| Solvent: | benzene/acetone/propionic acid (1:1:1) | |
| Concentration of metal compounds: | 15% by weight | |
| Substrate: | zirconia thin plate stabilized with yttrium | |
| Calcination: | 1st Stage | 2nd Stage |
| Atmosphere: | air | oxygen |
| Temperature: | 800° C. | 800° C. |
| Time: | 2 hours | 5 hours |
| Number of repetition: | 10 times | |
| Critical temperature: | | |
| On set: | 27K | |
| Perfect superconductive: | 10K | |

EXAMPLE 3

| Metal compounds: (Molar ratio of metal) | lanthanum butoxide (La 1.90) barium ethoxide (Ba 0.10) copper methoxide (Cu 1.00) | | |
|---|---|---|---|
| Solvent: | propionic acid/ethanol (2:1) | | |
| Concentration of metal compounds: | 20% by weight | | |
| Substrate: | alumina thin plate | | |
| Calcination: | 1st Stage | 2nd Stage | |
| Atmosphere: | argon | air | oxygen |
| Temperature: | 500° C. | 900° C. | 800° C. |
| Time: | 0.5 hour | 1 hour | 4 hours |
| Number of repetition: | 10 times | | |
| Critical temperature: | | | |
| On set: | 30K | | |
| Perfect superconductive: | 8K | | |

EXAMPLE 4

| Metal compounds: (molar ratio of metal) | lanthanum acetylacetonate (La 1.85) strontium naphthenate (Sr 0.15) copper ethoxide (Cu 1.00) | |
|---|---|---|
| Solvent: | pyridine/propionic acid (2:1) | |
| Concentration of metal compounds: | 10% by weight | |
| Substrate: | SiC fiber | |
| Calcination: | 1st Stage | 2nd Stage |
| Atmosphere: | argon | oxygen |
| Temperature: | 800° C. | 600° C. |
| Time: | 2 hours | 2 hours |
| Number of repetition: | 10 times | |
| Critical temperature: | | |
| On set: | 28K | |
| Perfect superconductive: | 18K | |

EXAMPLE 5

| Metal compounds: (molar ratio of metal) | lanthanum ethoxide (La 1.90) barium butoxide (Ba 0.03) strontium caprylate (Sr 0.07) copper butyrate (Cu 1.00) | |
|---|---|---|
| Solvent: | acetone/propionic acid (1:1) | |
| Concentration of metal compounds: | 10% by weight | |
| Substrate: | silver thin wire (diameter 100 um) | |
| Calcination: | 1st Stage | 2nd Stage |
| Atmosphere: | reduced pressure | oxygen |
| Temperature: | 800° C. | 570° C. |
| Time: | 2 hours | 2 hours |
| Number of repetition: | 10 times | |
| Critical temperature: | | |

| | -continued | |
|---|---|---|
| On set: | 27K | |
| Perfect superconductive: | 16K | |

EXAMPLE 6

| Metal compounds: (Molar ratio of metal) | lanthanum isopropoxide (La 1.90) barium isopropoxide (Ba 0.10) copper methoxide (Cu 1.00) | |
|---|---|---|
| Solvent: | propionic acid/ethanol (2:1) | |
| Concentration of metal compounds: | 15% by weight | |
| Substrate: | stainless steel thin plate | |
| Calcination: | 1st Stage | 2nd Stage |
| Atmosphere: | nitrogen | oxygen |
| Temperature: | 850° C. | 600° C. |
| Time: | 2 hours | 5 hours |
| Number of repetition: | 10 times | |
| Critical temperature: | | |
| On set: | 30K | |
| Perfect superconductive: | 23K | |

EXAMPLE 7

| Metal compounds: (Molar ratio of metal) | yttrium butyrate (Y 1.00) barium butyrate (Ba 2.00) copper butyrate (Cu 3.00) | |
|---|---|---|
| Solvent: | propionic acid/ethanol/acetone (1:1:1) | |
| Concentration of metal compounds: | 10% by weight | |
| Substrate: | alumina tube | |
| Calcination: | 1st Stage | 2nd Stage |
| Atmosphere: | air | oxygen |
| Temperature: | 500° C. | 800° C. |
| Time: | 1 hour | 2 hours |
| Number of repetition: | 15 times | |
| Critical temperature: | | |
| On set: | 95K | |
| Perfect superconductive: | 18K | |

EXAMPLE 8

| Metal compounds: (Molar ratio of metal) | lanthanum nitrate (La 1.90) calcium nitrate (Ca 0.10) copper nitrate (Cu 1.00) | |
|---|---|---|
| Solvent: | acetylacetone/methanol (1:9) | |
| Concentration of metal compounds: | 20% by weight | |
| Substrate: | SiC fiber | |
| Calcination: | 1st Stage | 2nd Stage |
| Atmosphere: | reduced pressure | oxygen |
| Temperature: | 900° C. | 570° C. |
| Time: | 5 min. | 2 hours |
| Number of repetition: | 8 times | |
| Critical temperature: | | |
| On set: | 32K | |
| Perfect superconductive: | 15K | |

EXAMPLE 9

| Metal compounds: (Molar ratio of metal) | yttrium acetylacetonate (Y 1.00) barium acetylacetonate (Ba 2.00) copper acetylacetonate (Cu 3.00) |
|---|---|
| Solvent: | pyridine/propionic acid (2:1) |
| Concentration of metal compounds: | 10% by weight |
| Substrate: | zirconia thin plate stabilized with yttrium |

-continued

| Calcination: | 1st Stage | 2nd Stage |
|---|---|---|
| Atmosphere: | argon | oxygen |
| Temperature: | 800° C. | 800° C. |
| Time: | 1 hour | 2 hours |
| Number of repetition: | 10 times | |
| Critical temperature: | | |
| On set: | 90K | |
| Perfect superconductive: | 20K | |

EXAMPLE 10

| Metal compounds: | lanthanum ethoxide (La 1.85) | |
|---|---|---|
| (Molar ratio | barium butyrate (Ba 0.15) | |
| of metal) | copper methoxide (Cu 1.00) | |
| Solvent: | naphthenic acid/butanol/ | |
| | propionic acid (1:1:1) | |
| Concentration | 20% by weight | |
| of metal compounds: | | |
| Substrate: | silver-coated | |
| | titanium wire (diameter 1 mm) | |
| Calcination: | 1st Stage | 2nd Stage |
| Atmosphere: | air | oxygen |
| Temperature: | 800° C. | 600° C. |
| Time: | 1 hour | 2 hours |
| Number of repetition: | 10 times | |
| Critical temperature: | | |
| On set: | 30K | |
| Perfect superconductive: | 13K | |

EXAMPLE 11

| Metal compounds: | yttrium stearate (Y 1.00) | |
|---|---|---|
| (Molar ratio | barium naphthenate (Ba 2.00) | |
| of metal) | copper naphthenate (Cu 3.00) | |
| Solvent: | propionic acid/butanol (1:1) | |
| Concentration | 20% by weight | |
| of metal compounds: | | |
| Substrate: | zirconia thin plate stabilized | |
| | with yttrium | |
| Calcination: | 1st Stage | 2nd Stage |
| Atmosphere: | argon | oxygen |
| Temperature: | 500° C. | 800° C. |
| Time: | 0.5 hour | 2 hours |
| Number of repetition: | 10 times | |
| Critical temperature: | | |
| On set: | 90K | |
| Perfect superconductive: | 23K | |

EXAMPLE 12

| Metal compounds: | yttrium carbonate (Y 1.00) | |
|---|---|---|
| (Molar ratio | barium peroxide (Ba 2.00) | |
| of metal) | copper oxide (Cu 3.00) | |
| Solvent: | nitric acid/acetone (9:1) | |
| Concentration | 5% by weight | |
| of metal compounds: | | |
| Substrate: | alumina porous thin plate | |
| Calcination: | 1st Stage | 2nd Stage |
| Atmosphere: | air | oxygen |
| Temperature: | 900° C. | 700° C. |
| Time: | 5 min. | 2 hours |
| Number of repetition: | 10 times | |
| Critical temperature: | | |
| On set: | 95K | |
| Perfect superconductive: | 20K | |

EXAMPLE 13

| Metal compounds: | yttrium naphthenate (Y 1.00) | |
|---|---|---|
| (Molar ratio | barium naphthenate (Ba 2.00) | |
| of metal) | copper naphthenate (Cu 3.00) | |
| Solvent: | toluene or butanol | |
| Concentration | 20% by weight | |
| of metal compounds: | | |
| Substrate: | silver thin plate | |
| Calcination: | 1st Stage | 2nd Stage |
| Atmosphere: | air | oxygen |
| Temperature: | 500° C. | 800° C. |
| Time: | 0.5 hour | 24 hours |
| Number of repetition: | 10 times | |
| Critical temperature: | | |
| On set: | 80K | |
| Perfect superconductive: | 20–45K | |

EXAMPLE 14

| Metal compounds: | yttrium caprylate (Y 1.00) | |
|---|---|---|
| (Molar ratio | barium caprylate (Ba 2.00) | |
| of metal) | copper caprylate (Cu 3.00) | |
| Solvent: | propionic acid/butanol (1:1) | |
| Concentration | 20% by weight | |
| of metal compounds: | | |
| Substrate | silver wire | |
| Calcination: | 1st Stage | 2nd Stage |
| Atmosphere: | argon | oxygen |
| Temperature: | 500° C. | 800° C. |
| Time: | 0.5 hour | 24 hours |
| Number of repetition: | 10 times | |
| Critical Temperature: | | |
| On set: | 80K | |
| Perfect superconductive: | 25K | |

EXAMPLE 15

| Metal compounds: | yttrium laurate (Y 1.00) | |
|---|---|---|
| (Molar ratio | barium laurate (Ba 2.00) | |
| of metal) | copper laurate (Cu 3.00) | |
| Solvent: | propionic acid/toluene (1:1) | |
| Concentration | 20% by weight | |
| of metal compounds: | | |
| Substrate: | silver-coated copper wire | |
| Calcination: | 1st Stage | 2nd Stage |
| Atmosphere: | air | oxygen |
| Temperature: | 700° C. | 800° C. |
| Time: | 0.5 hour | 24 hours |
| Number of repetition: | 10 times | |
| Critical temperature: | | |
| On set: | 85K | |
| Perfect superconductive: | 20K | |

EXAMPLE 16

| Metal compounds: | yttrium stearate (Y 1.00) | |
|---|---|---|
| (Molar ratio | barium stearate (Ba 2.00) | |
| of metal) | copper stearate (Cu 3.00) | |
| Solvent: | propionic acid/toluene (1:1) | |
| Concentration | 20% by weight | |
| of metal compounds: | | |
| Substrate: | platinum thin plate | |
| Calcination: | 1st Stage | 2nd Stage |
| Atmosphere: | air | oxygen |
| Temperature: | 700° C. | 800° C. |
| Time: | 0.5 hour | 24 hours |
| Number of repetition: | 10 times | |
| Critical temperature: | | |
| On set: | 80K | |

-continued

| | |
|---|---|
| Perfect superconductive: | 20K |

EXAMPLE 17

| | | |
|---|---|---|
| Metal compounds: | holmium naphthenate (Ho 1.00) | |
| (Molar ratio | barium naphthenate (Ba 2.00) | |
| of metal) | copper naphthenate (Cu 3.00) | |
| Solvent: | butanol or toluene | |
| Concentration | 20% by weight | |
| of metal compounds: | | |
| Substrate: | zirconia thin plate stabilized with yttrium | |
| Calcination: | 1st Stage | 2nd Stage |
| Atmosphere: | air | oxygen |
| Temperature: | 700° C. | 800° C. |
| Time: | 0.5 hour | 24 hours |
| Number of repetition: | 10 times | |
| Critical temperature: | | |
| On set: | 75K | |
| Perfect superconductive: | 30K | |

EXAMPLE 18

| | | |
|---|---|---|
| Metal compounds: | heavy rare earth naphthenates | |
| (molar ratio | (heavy rare earth* 1.00) | |
| of metal) | barium naphthenate (Ba 2.00) | |
| | copper naphthenate (Cu 3.00) | |
| Solvent: | butanol or toluene | |
| Concentration | 20% by weight | |
| of metal compounds: | | |
| Substrate: | zirconia thin plate stabilized with yttrium | |
| Calcination: | 1st Stage | 2nd Stage |
| Atmosphere: | air | oxygen |
| Temperature: | 700° C. | 800° C. |
| Time: | 0.5 hour | 24 hours |
| Number of repetition: | 10 times | |
| Critical temperature: | | |
| On set: | 80K | |
| Perfect superconductive: | 30K | |

(Heavy rare earth: 44% Er, 40% Yb, balance Lu and Ho)

EXAMPLE 19

| | | |
|---|---|---|
| Metal compounds: | yttrium nitrate (Y 1.00) | |
| (Molar ratio | barium nitrate (Ba 2.00) | |
| of metal) | copper nitrate (Cu 3.00) | |
| Solvent: | dimethylsulfoxide | |
| Concentration | 20% by weight | |
| of metal compounds: | | |
| Substrate: | zirconia thin plate stabilized with yttrium | |
| Calcination: | 1st Stage | 2nd Stage |
| Atmosphere: | air | oxygen |
| Temperature: | 900° C. | 800° C. |
| Time: | 5 min. | 24 hours |
| Number of repetition: | 10 times | |
| Critical temperature: | | |
| On set: | 80K | |
| Perfect superconductive: | 30K | |

EXAMPLE 20

| | |
|---|---|
| Metal compounds: | yttrium nitrate (Y 1.00) |
| (Molar ratio | barium nitrate (Ba 2.00) |
| of metal) | copper nitrate (Cu 3.00) |
| Solvent: | formamide |
| Concentration | 20% by weight |
| of metal compounds: | |

-continued

| | | |
|---|---|---|
| Substrate: | strontium titante thin plate | |
| Calcination: | 1st Stage | 2nd Stage |
| Atmosphere: | air | oxygen |
| Temperature: | 900° C. | 800° C. |
| Time: | 5 min. | 24 hours |
| Number of repetition: | 10 times | |
| Critical temperature: | | |
| On set: | 70K | |
| Perfect superconductive: | 30K | |

EXAMPLE 21

| | | |
|---|---|---|
| Metal compounds: | yttrium nitrate (Y 1.00) | |
| (Molar ratio | barium nitrate (Ba 2.00) | |
| of metal) | copper nitrate (Cu 3.00) | |
| Solvent: | N-methylacetamide | |
| Concentration | 10% by weight | |
| of metal compounds: | | |
| Substrate: | barium titante thin plate | |
| Calcination: | 1st Stage | 2nd Stage |
| Atmosphere: | air | oxygen |
| Temperature: | 900° C. | 800° C. |
| Time: | 5 min. | 24 hours |
| Number of repetition: | 20 times | |
| Critical temperature: | | |
| On set: | 80K | |
| Perfect superconductive: | 35K | |

EXAMPLE 22

| | | |
|---|---|---|
| Metal compounds: | yttrium nitrate (Y 1.00) | |
| (Molar ratio | barium nitrate (Ba 2.00) | |
| of metal) | copper nitrate (Cu 3.00) | |
| Solvent: | pyridine/propionic acid (2:1) | |
| Concentration | 10% by weight | |
| of metal compounds: | | |
| Substrate: | strontium titante thin plate | |
| Calcination: | 1st Stage | 2nd Stage |
| Atmosphere: | air | oxygen |
| Temperature: | 900° C. | 800° C. |
| Time: | 5 min. | 24 hours |
| Number of repetition: | 20 times | |
| Critical temperature: | | |
| On set: | 80K | |
| Perfect superconductive: | 30K | |

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all the changes which come within the meaning and range of equivalency of the claims are therefore intended to be embraced therein.

We claim:

1. A method of preparing a superconductive material having a ceramic superconductive layer of metal oxides provided on a substrate selected from the group consisting of metals, metal alloys, zirconia, titania, silicon carbide and graphite, said method comprising the steps of:
   (a) dissolving a blend of compounds of the metals in said metal oxides in an organic solvent to provide a solution consisting essentially of said organic solvent and said compounds dissolved therein, said compounds being selected from the group consisting of naphthenates and caprylates of said metals;

(b) applying said solution on the substrate to form a liquid film;
(c) drying said liquid film; and
(d) calcining said dried film to convert said metal compounds into said metal oxides.

2. A method as claimed in claim 1, wherein said substrate is in the form of a wire or a plate.

3. A method as claimed in claim 1, wherein said metal compounds are compounds capable of forming oxides upon calcination at 100° C. or less.

4. A method as claimed in claim 1, wherein step (d) is performed at a temperature of 500–1000° C. for a period of time of 0.5 hour or more.

5. A method as claimed in claim 1, wherein steps (a) through (d) are repeated until said superconductive layer has a thickness of 0.01–20 μm.

6. A method as claimed in claim 1, wherein step (d) is performed at a temperature of 500–1000° C. in an oxygen-containing atmosphere.

7. A method as claimed in claim 6, wherein the calcination in the oxygen-containing atmosphere is preceded by calcination in an oxygen-free atmosphere.

8. A method as claimed in claim 1, wherein said solution contains a first compound selected from the group consisting of Y compounds, La compounds, Nd compounds, Sm compounds, Eu compounds, Gd compounds, Dy compounds, Ho compounds, Er compounds, Yb compounds, Lu compounds and mixtures thereof, a second compound selected from the group consisting of Ba compounds, Sr compounds, Ca compounds and mixtures thereof and a Cu compound so that said superconductive layer has a formula:

$$AB_2Cu_3O_{7-x}$$

wherein A stands for Y, La, Nd, Sm, Eu, Gd, Dy, Ho, Er, Yb, Lu, or a mixture of two or more thereof, B stands for Ba, Sr, Ca or a mixture of two or more thereof, and x stands for a number greater than −1 but less than +1.

9. A method as claimed in claim 1, wherein said solution contains a La compound, a compound selected from the group consisting of Ba compounds, Sr compounds, Ca compounds and mixtures thereof and a Cu compound so that said superconductive layer has a formula:

$$(La_{1-y}Z_y)_2CuO_{4-z}$$

wherein Z stands for Ba, Sr, Ca or a mixture of two or more thereof, y is greater than 0 but not greater than 0.2 and z is a number less than 1 but not less than 0.

10. A method as claimed in claim 1, wherein said substrate is formed of a metal, metal oxide or a ceramic.

11. A superconductive material obtained by the method according to claim 1.

12. A superconductive material obtained by the method of claim 8.

13. A superconductive material obtained by the method of claim 9.

14. The method of claim 1 wherein said organic solvent is a member selected from the group consisting of hydrocarbons, alcohols, ketones, ethers, aldehydes, organic acids, esters, amines, amides, dimethylsulfoxide, heterocyclics and combinations thereof.

15. The method of claim 1 wherein said organic solvent is selected from the group consisting of butanol, benzene, acetone, pyridine, toluene, propionic acid, ethanol and mixtures thereof.

16. A method of preparing a superconductive material having a ceramic superconductive layer of metal oxides provided on a substrate, said method comprising the steps of:
() dissolving a sufficient amount of a blend of acetylacetonates of the metals in said metal oxides in an organic solvent mixture of pyridine and propionic acid to provide a solution containing 3–40% by weight of said acetylacetonates;
(b) applying said solution on the substrate to form a liquid film;
(c) drying said film; and
(d) calcining said dried film to convert said metal compounds into said metal oxides.

17. The method of claim 16 wherein said substrate is selected from the group consisting of metals, metal alloys, zirconia, titania, silicon carbide and graphite.

* * * * *

UNITED STATES PATENT AND TRADEMARK OFFICE
CERTIFICATE OF CORRECTION

PATENT NO.  : 5,039,654
DATED       : August 13, 1991
INVENTOR(S) : MIZUTA et al It is certified that error appears in the above-identified patent and that said Letters Patent is hereby corrected as shown below:

Col. 11, line 10, "100°C" should read --1000°C--.

Col. 12, line 31, "( )" should read --(a)--.

Signed and Sealed this

Ninth Day of March, 1993

*Attest:*

STEPHEN G. KUNIN

*Attesting Officer*          *Acting Commissioner of Patents and Trademarks*